June 23, 1964 D. B. DANIEL 3,138,766

VOLUME LIMITER-EXPANDER

Original Filed Aug. 8, 1956

2 Sheets-Sheet 1

INVENTOR
DONALD B. DANIEL
BY
Campbell, Brumbaugh, Free & Graves
HIS ATTORNEYS

June 23, 1964 D. B. DANIEL 3,138,766

VOLUME LIMITER-EXPANDER

Original Filed Aug. 8, 1956 2 Sheets-Sheet 2

INVENTOR
DONALD B. DANIEL
BY
Campbell, Brumbaugh, Free & Graves
HIS ATTORNEYS

United States Patent Office 3,138,766
Patented June 23, 1964

3,138,766

VOLUME LIMITER-EXPANDER

Donald B. Daniel, Saugus, Calif., assignor to Electronic Safety Engineering Company, Oklahoma City, Okla., a corporation of Oklahoma Continuation of application Ser. No. 602,781, Aug. 8, 1956. This application Sept. 23, 1960, Ser. No. 59,147
4 Claims. (Cl. 330—123)

The present invention relates to automatic variable gain amplifiers and more particulary to new and improved automatic variable gain amplifier means which is capable of effecting volume adjustment (i.e., compression or expansion) as a function of input signal level in a desired manner.

This is a continuation of my copending U.S. application Serial No. 602,781, filed August 8, 1956, now abandoned.

In the field of electrical communication by electrical signals, it is often desirable to compress the wide range of signal amplitudes that may be generated by a transducer such as a microphone, for example, into a smaller range. Where, however, a large degree of volume compression or limiting is used in automatically controlling the gain of an audio amplifier, for example, the background noise at the place of origin of the sound becomes a critical problem. This is attributable directly to the characteristic of the limiting amplifier which provides maximum gain for weak signals such as room noise.

It is an object of the invention, accordingly, to provide new and improved automatic variable gain amplifier means which is free from the above-noted disadvantage of the prior art.

Another object of the invention is to provide new and improved automatic variable gain amplifier means which is capable of a large degree of volume compression without adversely affecting the signal-to-noise ratio.

A further object of the invention is to provide new and improved automatic variable gain amplifier means of the above character which embodies high speed squelching means that is rendered effective when the signal drops below a threshold level.

Still another object of the invention is to provide new and improved automatic variable gain amplifier means which is capable of volume expansion at low distortion and high speed.

These and other objects of the invention are attained by providing automatic variable gain amplifier means comprising two resistance coupled push-pull, grid bias limiting amplifier stages, arranged so that the limiting action in the first stage does not come into play until the second stage is operating near its maximum capabilities. In this fashion, it is possible to obtain more than twice the limiting action of one stage when compared at equal distortion levels. Volume expansion at low signal levels is rectifier means which is operable within limits to reduce the bias on the control electrodes of the tubes in the second stage, these being of the variable gain type. This volume expansion means also serves to provide for high speed squelching (cutting off) of the second amplifier stage when the signal drops below a predetermined threshold level. As a result, background noise between intermittent sounds such as the words of a speaker, for example, is effectively eliminated.

Further objects and advantages of the invention will be apparent to those skilled in the art from a reading of the following detailed description taken in conjunction with the accompanying drawings, in which.

Figures 1, 2, 3:
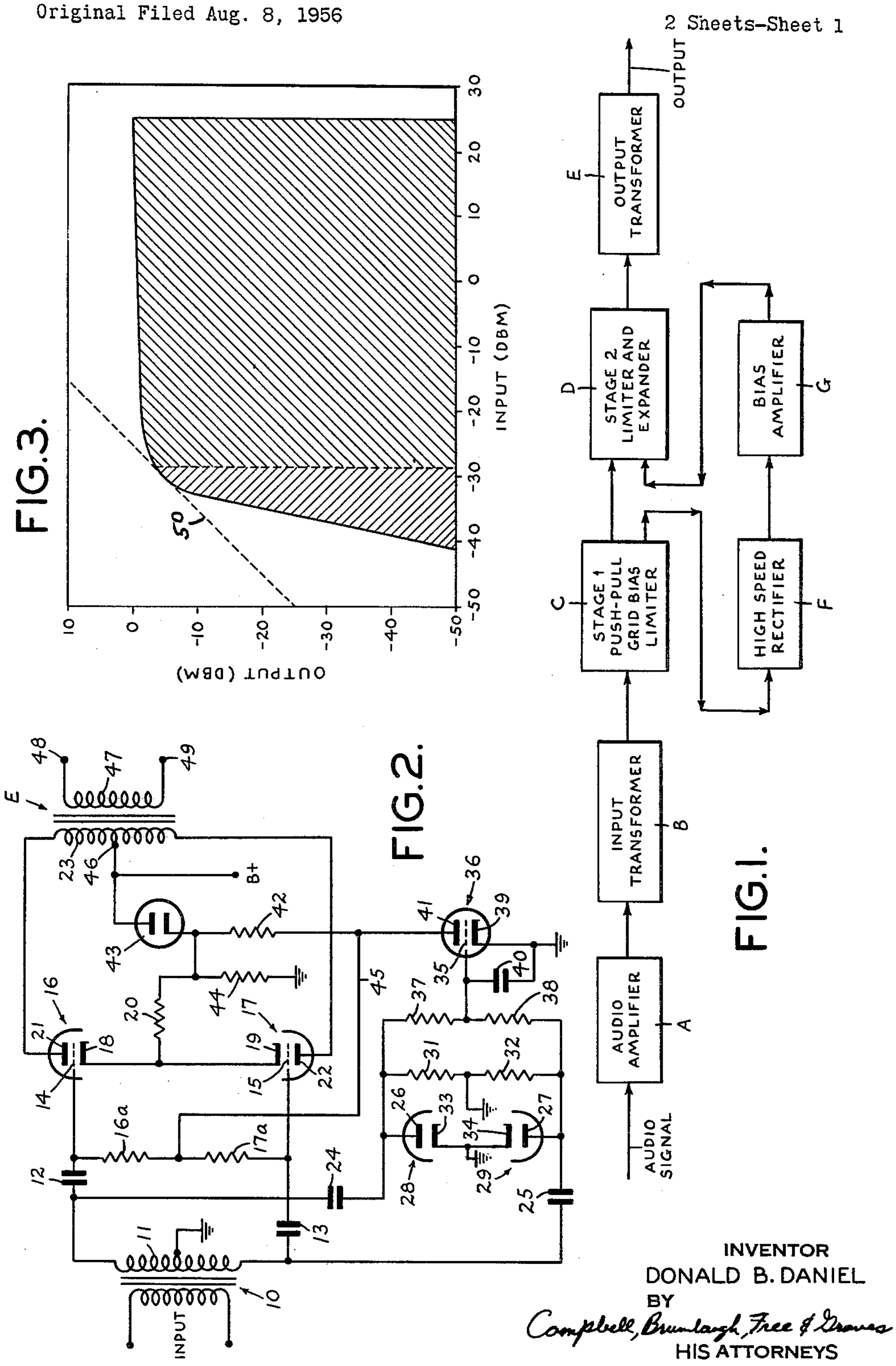
FIG. 1 is a block diagram of a typical automatic variable gain amplifier system constructed according to the invention.
FIG. 2 is a circuit diagram of a basic two stage limiter-expander amplifier unit according to the invention which forms part of the amplifier system shown in FIG. 1.
FIG. 3 is a graph showing a typical input-output characteristic for a two stage variable gain amplifier of the type shown in FIG. 2.

Referring now to the block diagram of FIG. 1, an automatic variable gain amplifier system according to the invention may comprise, for example, an audio amplifier A which receives an audio input signal and supplies a signal to an input transformer B in a first push-pull grid bias limiter stage C. The output of the stage C is fed to a second limiter stage D including an output transformer E which provides an output at its terminals. The second limiter stage D also provides expansion for signals of low level up to a predetermined amplitude and to this end its gain is controlled by a bias signal derived by passing the output signal from the first stage through a high speed rectifier F and a bias amplifier G.

As shown in FIG. 2, the second limiter stage D comprises an input transformer 10 having a secondary coil 11 adapted to produce two identical signals of opposite phase on either side of a grounded centertap. The secondary coil is connected through two condensers 12 and 13 to the control grid electrodes 14 and 15 of two electron tubes 16 and 17, respectively, the series connected grid leaks 16*a* and 17*a* also being connected to the control grids 14 and 15, respectively. The amplifier tubes 16 and 17 are of the type commonly known as variable mu tubes, being designed to provide a decreasing amplification (mu) with increasing grid voltage, and they may be dual triodes of the type designated 6BC8 in a common envelope. The cathodes 18 and 19 of the tubes 16 and 17 are connected together and in series with a cathode biasing resistor 20, while the plate electrodes 21 and 22, respectively, are connected to the primary winding 23 of the output transformer E.

The signal appearing at the terminals of the secondary winding 11 of the transformer 10 is also supplied through the condensers 24 and 25 to the anodes 26 and 27, respectively, of two rectifiers 28 and 29, which may be electron tubes of the type designated 6AT6, for example, in a common envelope. The anodes 26 and 27 of the diode rectifiers 28 and 29 are connected to ground through two resistors 31 and 32, respectively, while their cathodes 33 and 34 are connected together. The anodes 26 and 27 are also connected to the control grid 35 of a conventional triode amplifier 36, which may also be of the type designated 6AT6, through the resistors 37 and 38, respectively.

The control grid 35 of the triode 36 is connected to the cathode 39, which is grounded through a condenser 40. The anode 41 of the tube 36 is connected through a plate resistor 42 and a tube 43 which may be of the type designated OB–2 to the positive terminal B+ of the plate voltage supply (not shown). The junction between the resistor 42 and the tube 43 is connected to the junction between the cathode biasing resistor 20 and a resistor 44 which is connected to ground. Thus, the tube 43 acts as a voltage regulator by maintaining a constant current through the resistor 44 to apply a constant potential to the cathode resistor 20 when the amplifier 36 conducts, drawing current through the resistor 42. As will be explained in greater detail below, part of the grid bias for the tubes 16 and 17 is derived from the voltage drop across the resistor 42 and to this end, the plate 41 of the tube 36 is connected by a conductor 45 to the junction between the grid leaks 16*a* and 17*a*.

The primary winding 23 of the output transformer E has a centertap 46 which is also connected to the terminal B+ so as to supply plate voltage for the tubes 16 and 17. The transformer E also has a secondary winding 47 which is provided with output terminals 48 and 49 for connection of the output to utilization equipment such as the modulator for a transmitter, for example.

In operation, when no input signal is present, the rectifiers 28 and 29 develop no bias and the tube 36 conducts a current from its cathode 39 to its plate 41 because of the lack of cut-off bias on the grid 35 thereof. This current flows through the resistor 42 and develops a voltage drop that, added to the static bias developed by the resistor 20, makes the grids 14 and 15 of the tubes 16 and 17 very negative with respect to their cathodes 18 and 19, respectively. As stated, the tubes 16 and 17 are variable mu tubes and their mu approaches zero with no input signal and thus the gain of the expander-limiter amplifier of FIG. 2 is near zero.

When an input signal is applied to the transformer 10, it is coupled by the condensers 24 and 25 to the diode rectifiers 28 and 29. Current conducted through the diodes 28 and 29 charges the condensers 24 and 25 at a very fast rate which is a function of the capacity of the condensers 24 and 25 and the series resistance of the tubes 16 and 17 and the transformer 10. Charge rates of a few miscroseconds are practical. When the condensers 24 and 25 start to charge, they also start to discharge through the resistors 31 and 32. The rate of discharge will be relatively slow if the resistors 31 and 32 are large. Thus, the equivalent of push-pull grid bias is developed across the resistors 31 and 32. The voltages across the resistors 31 and 32 are supplied to the grid 31 of the tube 36 through the identical resistors 37 and 38.

Because of the push-pull input and parallel output of the rectifier circuit comprising the diodes 28 and 29 and the circuit elements connected thereto, the fundamental A.C. signal is not present at the grid 35 of the tube 36 and the harmonics are filtered by a combination of filter network formed by the resistors 37 and 38 and the capacitor 40. The value of the capacitor 40 can be very small and in some cases the input capacity of the tube 36 will be sufficient for the purpose. This results in a bias rectifying circuit that has very fast rise time and in practical cases may be only a few milliseconds.

As the amplitude of the input signal increases, increasing negative bias is applied to the grid 35 of the tube 36, so that its plate current is reduced, reducing the negative bias applied to the tubes 16 and 17 and increasing the gain of the limiter-expander amplifier.

If the input signal continues to increase in amplitude, a point will be reached where the tube 36 is cut off and no bias is applied to the grids of the tubes 16 and 17 except the static cathode bias developed across the resistor 20. Up to this point, the amplifier of FIG. 2 has a volume expansion characteristic.

At a point where the input signal to the tubes 16 and 17 exceeds the sum of the static bias across the resistor 20 and any bias developed across the resistor 42, the tubes 16 and 17 will begin to draw grid current and will create conditions for developing limiting action in the amplifier.

In the case of the tube 16, grid current flows from the cathode 18 to the grid 14 and charges the condenser 12 to some negative potential proportional to the input signal. The speed with which the condenser 12 charges is a function of the capacity of the condenser 12 and the series resistance of the transformer 10 and the grid cathode circuit of the tube 16. In a practical case, time constants of 100 microseconds or less may be achieved. When the condenser 12 becomes charged, it will start to discharge through the resistor 16*a*. If the resistor 16*a* is large, the discharge rate will be much slower than the charge rate, for example, 10,000 microseconds, and a steady state (negative D.C.) bias will develop between the cathode 18 and the grid 14 of the tube 16 which will reduce the gain (mu) of this tube.

Since the same signal that is applied to the tube 16 is also applied to the tube 17, one hundred eighty degrees out of phase, a grid bias will also be developed between the cathode 19 and the grid 15 and a corresponding reduction in the gain (mu) of the tube 17 will also occur. The reduction in the gains of the two tubes 16 and 17 results in a gain reduction in the amplifier stage shown in FIG. 2. The harmonic distortion produced by the nonlinear transfer characteristic of the variable gain (mu) tubes is substantially removed by the even harmonic suppression effected in the output transformer E.

A representative input-output characteristic curve for an expander-limiter circuit of the type shown in FIG. 2 is illustrated in FIG. 3, in which the slant dotted line 50 represents the characteristic for a linear amplifier. It will be noted that for input signals of very low levels, say −40 dbm, for example, the negative bias voltage across the resistor 42 is very large so that the amplifier gain is very low. At −35 dbm, the bias across the resistor 42 is less. Some bias is developed by the resistor 20 but the resultant is less negative bias applied to the grids 14 and 15 of the tubes 16 and 17 so that a 25 db change in the amplifier gain obtains. This corresponds to a 5 to 1 volume expansion.

At a signal level of −30 dbm, the tube 36 is cut off and the tubes 16 and 17 are now biased only by the static bias developed across the cathode resistor 20 and by some voltage developed across the resistors 16*a* and 17*a* because of current drawn by the grids 14 and 15 of the tube 16 and 17. This is where the transition from expander action to limiter action starts.

At a signal level of −20 dbm, developed in the resistors 16*a* and 17*a* by grid current, the grid bias drawn by the tubes 16 and 17 is predominant and the amplifier gain decreases as the signal increases further, i.e., the amplifier now functions as a limiter.

Figure 4:
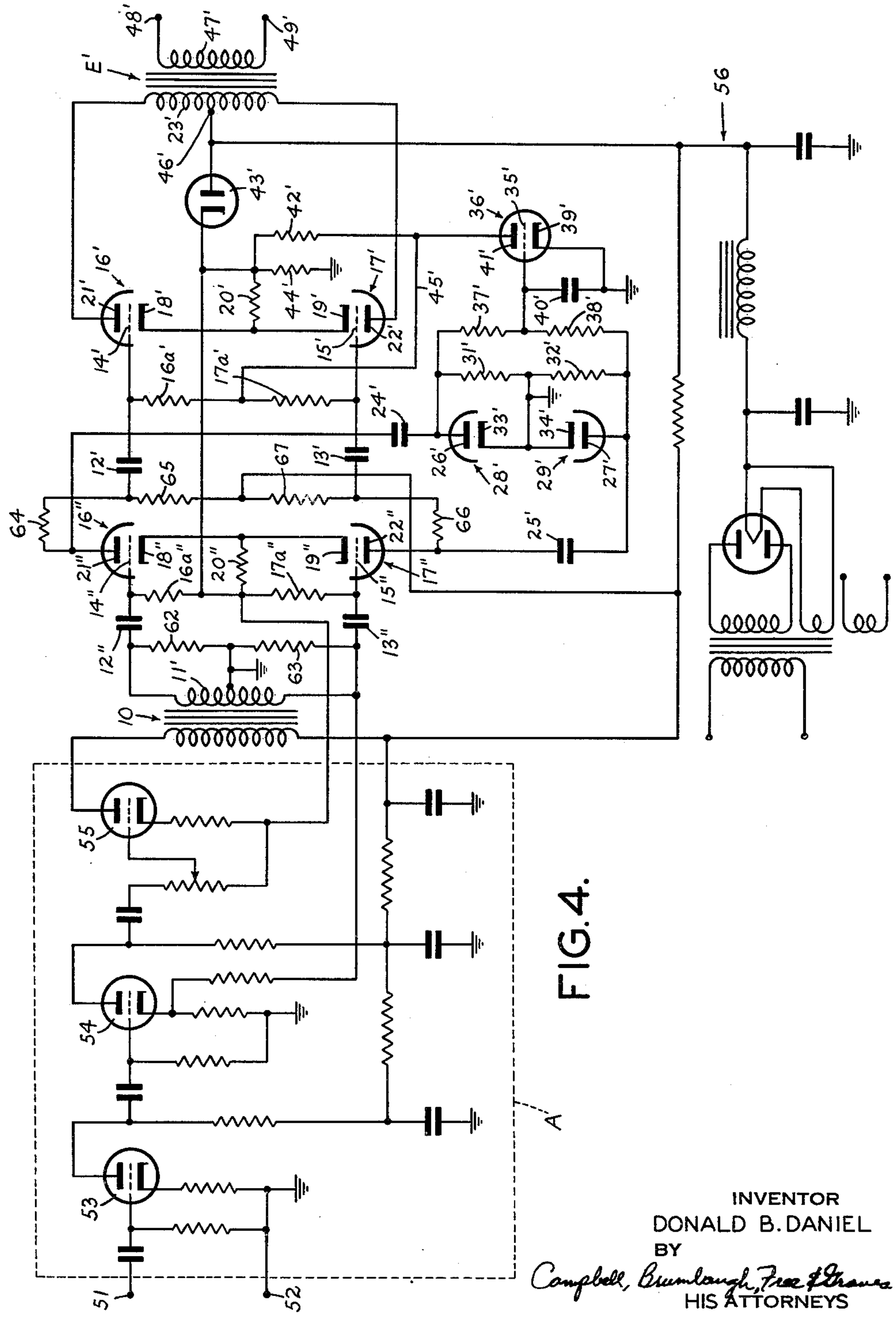
FIG. 4 is a circuit diagram of the resistance-coupled, limiter-expander amplifier system outlined generally in FIG. 1.

In FIG. 4 there is shown a complete schematic diagram of the novel automatic variable gain amplifier system shown in FIG. 1. The preamplifier outlined at A is a conventional one having input terminals 51 and 52 and three amplifier tubes 53, 54 and 55. Since it constitutes no part of the invention, a detailed description of the preamplifier circuit will not be given. The preamplifier is coupled through an input transformer 10′ to a variable gain amplifier circuit comprising two resistance-coupled push-pull, grid bias limiting amplifier stages in which the second stage is similar in all respects to the limiter-expander shown in FIG. 2 and the first stage comprises a push-pull grid bias limiter similar to that of FIG. 2. Accordingly, in FIG. 4, the components of the second stage similar to those of the limiter-expander amplifier circuit of FIG. 2 are indicated by primed reference characters and the elements of the first stage which are similar to those of the push-pull grid bias limiter of FIG. 2 are indicated by double primed reference numerals.

The various tubes of the automatic variable gain amplifier system are supplied with plate voltage derived from a conventional filtered rectifier power supply such as the one shown at 56.

To adjust the rate of charge of the condensers 12″ and 13″ to the desired value of a few microseconds as previously mentioned, the secondary coil 11′ of the input transformer may be shunted with two resistors 62 and 63. Two plate resistors 64 and 65, and 66 and 67, are provided for each of the tubes 16″ and 17″, respectively, with the resistors 64 and 66, connected between the plates 21″ and 22″ and the condensers 12′ and 13′, respectively, so that the signal applied to the plates of the diodes 28′ and 29′ is of greater amplitude than the signal applied to the grids 14′ and 15′ of the tubes 16′ and 17′ of the limiter-expander stage. The resistors 65 and 67 are connected between the power supply and the resistors 64 and 66, respectively.

To produce the desired sequential operation of the two limiter stages it is necessary to select the proper ratio of the resistor 65 to the sum of the resistors 64 and 65 and the ratio of the resistor 67 to the sum of the resistors 66 and 67. These ratios must be such that the effective gain from the resistor 62 to the resistor 16a′ and from the resistor 63 to the resistor 17a′ is the correct value to drive the second limiter, comprising the tubes 16′ and 17′, to near maximum limiting before the first limiter, comprising tubes 16″ and 17″, reaches the lower limiting threshold and starts to limit the volume. In addition, the resistors 65 and 67 must be of sufficiently low resistance to provide a drive source that is capable of charging the condensers 12′ and 13′ in the desired time of the few microseconds.

In operation, the first limiter stage of the automatic variable gain amplifier system maintains maximum amplification as the input signal increases in volume until the second stage approaches the maximum limiting conditions, for example, at approximately 20 dbm input signal where the characteristic curve of FIG. 3 approaches a straight line of shallow slope. At this point, the signal applied to the grids 14″ and 15″ of the grid bias limiter stage becomes sufficiently negative to overcome the static grid bias and reduce the amplification of the tubes 16″ and 17″ from the maximum value which was maintained at lower input signal volumes. Still greater input signal amplitudes further reduce the amplification of the tubes 16″ and 17″ until the cut-off point is approached and no further volume limiting is obtained. The effect on the characteristic curve of FIG. 3 is to flatten the slope still more and extend it to include higher input signal amplitudes.

An automatic variable gain amplifier system such as the one described in connection with FIG. 4 provides about two and one-half times the limiting performance of the limiter-expander shown in FIG. 2. If desired, successive resistance-coupled grid bias limiter and limiter-expander circuits may be connected in series to produce an even greater degree of volume compression. However, the coupling must be done with transformers to avoid signal distortion.

To properly reproduce the signal in its original form, the receiver may be provided with a complementary variable gain amplifier system which limits the range of signal amplitudes at low volume and expands the range at high volume, thereby removing the distortion effected by the variable gain amplifiers at the transmitter and reproducing the signal with its original range of volumes.

It will be readily seen from the above that the invention provides novel means for compressing the range of amplitudes of an informational signal having a much greater range of operation that was heretofore possible without the need for transformer coupling all successive limiting stages to avoid distortion.

It will be understood that the embodiment described above is illustrative rather than restrictive of the principle of the invention, and that various modifications and changes will be obvious to those skilled in the art which do not exceed the intended scope of the invention.

I claim:

1. In an automatic variable gain amplifier system, the combination of input means for receiving input signals to be amplified, amplifier means including a variable mu electron tube having a control electrode, a cathode electrode and a plate electrode, first circuit means including capacitor means connecting the input means to the control electrode to apply input signals thereto, first impedance means having a first end connected to a reference voltage point and a second end connected to the cathode electrode, second impedance means having a first end connected to the second end of the first impedance means, and bias control means connected between the input means and the second end of the second impedance means and normally drawing current through the second impedance means to provide a predetermined bias voltage on the control electrode with respect to the cathode electrode, said bias control means being responsive to increasing input signals up to a selected signal level to decrease the current drawn through the second impedance means as the input signal increases to reduce the bias voltage, and second bias control circuit means connected between the control electrode and the second end of the second impedance means and responsive to increasing control electrode current drawn by the variable mu electron tube to charge the capacitor means in the first circuit means so as to provide decreasing control electrode bias with increasing input signals above the selected signal level.

2. In an automatic variable gain amplifier system, the combination of input means for receiving input signals to be amplified, amplifier means having a first stage and a second stage, each of said stages including a variable mu electron tube having a control electrode, a cathode electrode and a plate electrode, first circuit means including capacitor means connecting the input means to the control electrode of the first stage electron tube to apply input signals thereto, first impedance means having a first end connected to a reference voltage point and a second end connected to the cathode electrode of one of said variable mu electron tubes, second impedance means having a first end connected to the second end of the first impedance means, bias control means connected between the input means and the second end of the second impedance means and normally drawing current through the second impedance means to provide a predetermined negative bias voltage on the control electrode with respect to the cathode electrode of the associated electron tube, said bias control means being responsive to increasing input signals up to a selected signal level to decrease the current drawn through the second impedance means as the input signal increases to reduce the bias voltage, and second bias control circuit means connected between the control electrode of said one of the electron tubes and the second end of the second impedance means and responsive to increasing control electrode current drawn by the electron tube to which it is connected to charge the capacitor means in the first circuit means so as to provide decreasing control electrode bias with increasing input signals above the selected signal level.

3. An automatic variable gain amplifier according to claim 2 including third bias control circuit means connected between the control electrode of the other of the electron tubes and another reference voltage point and responsive to increasing control electrode current drawn by the electron tube to which it is connected to provide decreasing control electrode bias with increasing input signals above a second signal level greater than the selected signal level.

4. In an automatic variable gain amplifier system, the combination of input means for receiving signals to be amplified, amplifier means including a pair of variable mu electron tubes connected in push-pull each having a control electrode, a cathode electrode, and a plate electrode, first circuit means including capacitor means connecting the input means to the grid electrodes of both electron tubes to apply input signals thereto, first impedance means having a first end connected to a reference voltage point and a second end connected to the cathode electrodes of the pair of electron tubes, second impedance means having a first end connected to the second end of the first impedance means, and bias control means connected between the input means and the second end of the second impedance means and normally drawing current through said second impedance means to provide a predetermined negative bias voltage on the control electrodes with respect to the cathode electrodes and responsive to increasing input signals up to a selected signal level to decrease the current drawn through the second impedance means as the input signal increases to reduce the bias voltage, and second bias control circuit means connected between the control electrodes and the second end of the second impedance means and responsive to increasing control electrode current drawn by the variable mu tubes to charge the capacitor means in the first circuit means so as to provide decreasing control electrode bias with increasing input signals above the selected signal level.

References Cited in the file of this patent

UNITED STATES PATENTS

| | | |
|---|---|---|
| 2,016,427 | Green | Oct. 8, 1935 |
| 2,462,452 | Yates | Feb. 22, 1949 |

UNITED STATES PATENT OFFICE

CERTIFICATE OF CORRECTION

Patent No. 3,138,766 June 23, 1964

Donald B. Daniel

It is hereby certified that error appears in the above numbered patent requiring correction and that the said Letters Patent should read as corrected below.

Column 1, line 55, after "is" first occurrence, insert -- provided by --; column 5, line 63, for "that" read -- than --.

Signed and sealed this 10th day of November 1964.

(SEAL)
Attest:

ERNEST W. SWIDER
Attesting Officer

EDWARD J. BRENNER
Commissioner of Patents